United States Patent [19]
Yonezawa et al.

[11] 3,963,630
[45] June 15, 1976

[54] LEAD ZIRCONATE-TITANATE POWDER OF PARTICLE SIZES BETWEEN 0.02 AND 0.2 MICRON, PROCESS FOR PRODUCING SAME, AND HIGH-DENSITY PIEZOELECTRIC CERAMICS MADE OF POWDER

[75] Inventors: Masatomo Yonezawa; Tomeji Ohno, both of Tokyo; Keizo Iwase, Shiga; Toshio Takada, Kyoto; Masao Kiyama, Kyoto; Toshikazu Akita, Kyoto, all of Japan

[73] Assignee: Nippon Electric Company Limited, Tokyo, Japan

[22] Filed: Feb. 7, 1975

[21] Appl. No.: 547,806

[30] Foreign Application Priority Data
Nov. 21, 1974   Japan.............................. 49-134663

[52] U.S. Cl............................... 252/62.9; 423/598; 106/73.3
[51] Int. Cl.².................... C04B 35/46; C04B 35/48
[58] Field of Search................... 252/62.9; 423/593, 423/598, 599; 106/73.3, 73.31

[56]        References Cited
        UNITED STATES PATENTS

| | | | |
|---|---|---|---|
| 2,892,955 | 6/1959 | Gulton | 252/62.9 X |
| 3,352,632 | 11/1967 | Sasaki | 252/629 X |
| 3,666,666 | 5/1972 | Haertling | 252/62.9 |
| 3,699,044 | 10/1972 | Dosch et al. | 252/62.9 |
| 3,699,045 | 10/1972 | Tsubovehi et al. | 252/62.9 |
| 3,708,438 | 1/1973 | Levy | 252/62.9 |

*Primary Examiner*—Jack Cooper
*Attorney, Agent, or Firm*—Hopgood, Calimafde, Kalil, Blaustein and Lieberman

[57]        ABSTRACT

Fine crystalline powder, from 0.02 to 0.2 micron in average particle size, of a composition $Pb(Zr.Ti)O_3$. Parts of Zr and Ti of the composition may be substituted for with Mn and Sb, Nb, and/or Ta. The powder is produced by preparing an acidic aqueous solution of the constituent metallic ions, neutralizing the solution to provide a suspension of hydroxides of the metals, and subjecting the suspension to hydrothermal reaction at 150°–300°C. The powder provides piezoelectric ceramics of a high sintered density without resorting to hot pressing.

4 Claims, 3 Drawing Figures

LEAD ZIRCONATE-TITANATE POWDER OF PARTICLE SIZES BETWEEN 0.02 AND 0.2 MICRON, PROCESS FOR PRODUCING SAME, AND HIGH-DENSITY PIEZOELECTRIC CERAMICS MADE OF POWDER

BACKGROUND OF THE INVENTION

This invention relates to fine crystalline powder of a piezoelectric ceramic composition of the lead zirconate-titanate system, a process for producing the powder, high-density piezoelectric ceramics made of the powder, and a method of manufacturing the piezoelectric ceramics. The piezoelectric ceramics according to this invention are suitable particularly to ultrasonic transducers, base plates for elastic surface waves, and elements for electrooptical applications. The piezoelectric ceramic composition may include, in place of parts of zirconium and titanium, manganese and antimony, niobium, and/or tantalum to remarkably improve the piezoelectric activities as described in U.S. Pat. No. 3,699,045.

Conventional lead-zirconate-titanate-system piezoelectric ceramics are generally manufactured by sintering. The sintered density of the conventional piezoelectric ceramics is about from 95 to 97% of the theoretical value. It has been very difficult, if not impossible, to provide piezoelectric ceramics whose sintered density is 98% or more of the theoretical value although piezoelectric ceramics of this high density are desirable in view of the reduced number of voids within the sintered bodies and in view of the resulting higher mechanical strength and higher smoothness of the mirrored surfaces.

Hot pressing known in the art of powder metallurgy may be resorted to on providing the piezoelectric ceramics of higher densities. The hot pressing, however, is not suitable to large-scale production at present. Alternatively, use may be made as the starting material of active powder of very fine particle sizes as reported by L. M. Brawn and K. S. Mazdiyasmi in "Journal of the American Ceramic Society," Volume 55, No. 11 (November, 1972), pp. 541–544. The fine powder is produced in general by preparing an aqueous solution of inorganic or organic compounds of the desired metallic or positive elements, subjecting the compounds to hydrolysis to make colloidal hydroxides of the metals deposit as precipitate, separating the precipitate from the mother liquor, and heating the separated precipitate to 500°C or higher to subject the same to decomposition and/or crystallization. It has, however, been inevitable that crystals of the pyrochlor type, harmful to manufacture of piezoelectric ceramics of the high sintered density, are produced besides the desired crystals of the perovskite structure. It has also been very difficult to carry out the separation because of the extreme fineness of the precipitate. In addition, it has been impossible to prevent the precipitate from missing from the resultant, which fact has often resulted in fluctuation of the compositional ratios.

SUMMARY OF THE INVENTION

It is therefore an object of the present invention to provide fine crystalline lead-zirconate-titanate-system powder of the piezoelectric nature and of the perovskite structure, which has an average particle size between 0.02 and 0.2 micron.

It is another object of this invention to provide fine powder of the type described, capable of providing piezoelectric ceramics whose sintered density without the hot pressing resorted to is 98% or more of the theoretical value.

It is still another object of this invention to provide fine powder of the type described, capable of being produced without the crystalline powder of the pyrochlor type.

It is yet another object of this invention to provide fine powder of the type described, capable of being readily produced.

It is a further object of this invention to provide fine powder of the type described, whose compositional ratio is little subjected to fluctuation.

It is a still further object of this invention to provide a process for producing the fine powder of the type described.

It is a yet further object of this invention to provide pizoelectric ceramics of the fine powder of the type described, whose sintered density without the hot pressing resorted to is 98% or more of the theoretical value, and a method of manufacturing the piezoelectric ceramics.

In accordance with this invention there is provided fine crystalline powder of the piezoelectric nature and of the perovskite structure, which has an average particle size between 0.02 and 0.2 micron and a composition represented by any one of the following three formulae:

1. $Pb(Zr.Ti)O_3$; 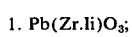

2. $Pb(Zr_p.Ti_q)O_3$, 

where p and q represent mol ratios and are given by:

$p + q = 1.00$, $0.10 \leq p \leq 0.55$, $0.45 \leq q \leq 0.90$;

and

3. $Pb[(Mn.Me)Zr.Ti]O_3$, 

where Me represents at least one chemical element selected from the group consisting of Sb, Nb, and Ta.

In accordance with this invention there is also provided a process for producing crystalline powder of a composition consisting essentially of positive elements Pb, Ti, Zr, Mn, Sb, Nb, and Ta in predetermined mol ratios and a negative element O, the mol ratios of Mn, Sb, Nb, and Ta including 0.00, comprising the steps of:

preparing an acidic aqueous solution of ions of the positive elements approximately in said predetermined mol ratios, neutralizing said aqueous solution to provide a suspension of hydroxides of the positive elements, subjecting said suspension to hydrothermal reaction at a temperature between 150° and 300°C to produce precipitate of said powder in a mother liquor, and separating said precipitate from said mother liquor. The powder thus produced has an average particle size between 0.02 and 0.2 micron.

The powder according to this invention provides, when sintered in air without hot pressing, piezoelectric ceramics whose sintered density is 98% or more of the theoretical value.

Figure 1:
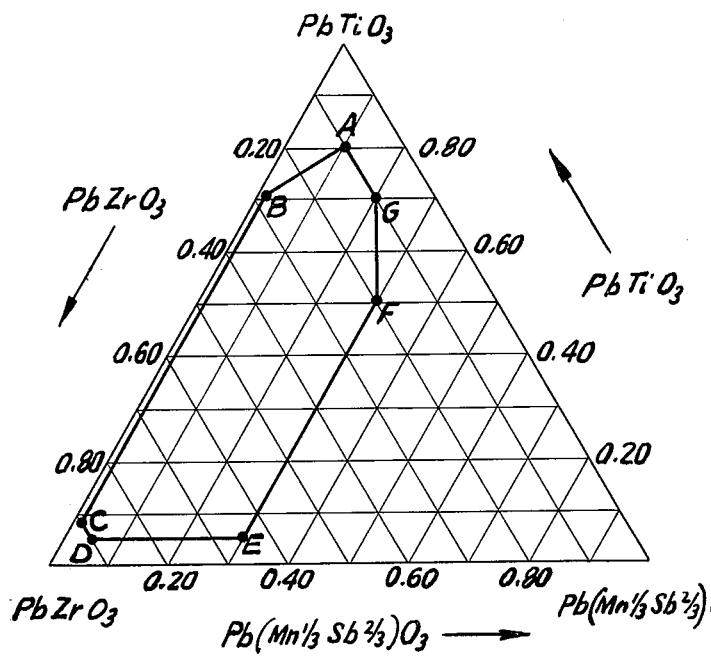
FIG. 1 is a triangular compositional diagram of solid solution of $Pb(Mn_{1/3}\cdot Sb_{2/3})O_3$, $PbTiO_3$, and $PbZrO_3$.

DESCRIPTION OF THE PREFERRED EMBODIMENTS:

In accordance with the instant invention, fine crystalline powder of the piezoelectric nature and of the perovskite structure is produced by preparing at first an acidic aqueous solution containing metallic or positive chemical elements, such as Pb, Ti, Zr, Mn, Sb, Nb, and Ta, in mol ratios approximately equal to the mol ratios in which the powder should contain the positive elements. What is necessary in preparing the solution is to select sufficiently pure water-soluble salts of the positive elements, such as chlorides and nitrates, to weigh the desired amounts of the respective salts, to put the weighed salts into sufficiently pure water, and to thoroughly stir the mixture. Thereafter, the solution is neutralized by the use of any one or more of the known agents, such as aqueous solution of NaOH, KOH, and $NH_4OH$, with water further added and stir carried on, to provide a suspension of hydroxides of the positive elements. It is to be pointed out that the salts may not completely be dissolved before the neutralization because the salts are gradually dissolved as the hydroxides are produced and that the neutralization may be put forward beyond the exact neutralization so that the suspension may slightly be basic.

In marked contrast to the conventional processes exemplified hereinabove in the preamble of the instant specification, the suspension is subsequently subjected to hydrothermal reaction with stir to provide crystalline precipitate. The reaction may be carried out in an autoclave, which is preferably made of stainless steel coated with heat-resistant high polymer, such as polytetrafluoroethylene known by the trade name Teflon. Through the X-ray analysis, it has been confirmed that it is difficult to obtain crystalline powder of the perovskite structure alone when the reaction is carried out at a temperature below 150°C. With a rise in the reaction temperature, the precipitate grows larger in its average particle size. The temperature above 300°C is objectionable from industrial point of view because the pressure in the reaction vessel becomes excessively high at such temperatures. Through the BET method, the precipitate produced by the hydrothermal reaction at a temperature between 150° and 300°C has been found to have an average particle size between 0.02 and 0.2 micron. The precipitate may be separated from the mother liquor by filtration. After dried, the precipitate results in the desired powder. The mol ratios of the positive elements in the powder are approximately the same as those of the positive elements in the weighed salts.

By way of example, about 60 grams of fine crystalline powder of $Pb(Mn_{1/3}\cdot Sb_{2/3})_{0.08}\cdot Ti_{0.495}\cdot Zr_{0.425}\cdot O_3$ were produced. At first, the chelatometry was carried out to determine the contents of Pb, Ti, Zr, and Mn in $PbCl_2$, $TiCl_4$, $ZrOCl_2\cdot 8H_2O$, and $MnCl_2\cdot 4H_2O$. Also, the redox titration was applied to $SbCl_3\cdot 7H_2O$ in order to determine the Sb content. The chlorides were weighed to provide 0.1858 mol of Pb, 0.09197 mol of Ti, 0.07897 mol of Zr, 0.004954 mol of Mn, and 0.009908 mol of Sb. The weighed chlorides were put into 500 cc. of water with thorough stir to provide an acidic aqueous solution. The solution was neutralized by 112 cc. of 10-N aqueous solution of NaOH with water further added thereto and stir carried forward to provide a suspension of hydroxides of the positive elements, 700 cc. in total. The suspension was put in a 1-liter autoclave and heated to 260°C for four hours with stir. After the reaction mixture was cooled to room temperature, the precipitate was separated from the mother liquor by filtration, washed with water, and dried at 70°C for twenty hours. The powder thereby obtained weighed 0.1858 mol and had an average particle size of 0.06 micron. The contents of Pb, Ti, Zr, Mn, and Sb ions remaining in the filtrate, 700 cc. in volume, were 0.003%, 0.004%, 0.08%, 0.04%, and 0.15% of the weighed positive elements. This shows that the mol ratios of the positive elements in the produced powder are little subject to fluctuation.

The fine crystalline powder produced as above was shaped into a cylindrical piece, 20 mm in diameter and 40 mm long, with addition of a small amount of water and under a pressure of 700 kg/cm². The piece was sintered in air for one hour at a temperature between 1150° and 1260°C. The sintered density of the ceramic piece was 98% or more of the theoretical value and even amounted to 99% or more.

The ceramic piece was sliced into disks, 1.0 mm thick. The disks having silver electrodes fired thereto were poled for piezoelectric activation by application thereto of an electric field of from 30 to 50 kV/cm in an oil bath of 100°C for one hour. After left as they stand for twenty-four hours, the radial electromechanical coupling coefficient ($k_r$) and the mechanical quality factor ($Q_m$) were determined by the use of the I. R. E. standard circuit, the electromechanical coupling coefficient being calculated from the measured resonance and antiresonsance frequencies. Also, the dielectric constant ($\epsilon$) and the dielectric loss factor ($\tan\delta$) were measured at 1 kHz.

Typical results for the piezoelectric ceramics made of the fine crystalline powder mentioned above and of similar powder according to this invention are listed in the following table. The table also shows typical results, with asterisks, which were obtained by piezoelectric ceramics made in accordance with conventional methods by crushing and mixing oxides of the desired positive elements in a ball mill, presintering the oxide powder at 900°C for one hour, and sintering the presintered pieces at 1290°C for one hour.

Table

| Sample No. | Me | Mol Ratios of Composition Pb(Mn$_{1/3}$Me$_{2/3}$)O$_3$ x | PbTiO$_3$ y | PbZrO$_3$ z | Sintered density (gr/cm$^3$) | $k_r$ (%) | $Q_m$ | $\epsilon$ | tan$\delta$ (%) |
|---|---|---|---|---|---|---|---|---|---|
| 1* | — | — | 0.55 | 0.45 | 7.58 | 7 | 30 | 340 | 1.4 |
| 2 | — | — | " | " | 7.88 | 10 | 100 | 390 | 1.1 |
| 3* | — | — | 0.48 | 0.52 | 7.57 | 40 | 230 | 1030 | 1.6 |
| 4 | — | — | " | " | 7.89 | 48 | 270 | 1100 | 1.4 |
| 5* | — | — | 0.40 | 0.60 | 7.55 | 28 | 290 | 440 | 3.3 |
| 6 | — | — | " | " | 7.84 | 33 | 370 | 480 | 1.8 |
| 7* | Sb | 0.05 | 0.55 | 0.40 | 7.61 | 35 | 3630 | 620 | 1.3 |
| 8 | " | " | " | " | 7.96 | 41 | 4550 | 700 | 1.0 |
| 9* | " | 0.08 | 0.495 | 0.425 | 7.58 | 49 | 2120 | 1100 | 1.6 |
| 10 | " | " | " | " | 7.99 | 56 | 2790 | 1200 | 1.2 |
| 11* | " | 0.10 | 0.30 | 0.60 | 7.68 | 31 | 4040 | 380 | 1.7 |
| 12 | " | " | " | " | 8.00 | 36 | 5500 | 430 | 1.3 |
| 13* | Nb | 0.05 | 0.55 | 0.40 | 7.60 | 31 | 3470 | 510 | 1.1 |
| 14 | " | " | " | " | 7.94 | 37 | 4660 | 590 | 0.8 |
| 15* | " | 0.10 | 0.45 | 0.45 | 7.57 | 56 | 1750 | 970 | 1.4 |
| 16 | " | " | " | " | 7.95 | 64 | 2530 | 1060 | 1.0 |
| 17* | " | 0.20 | 0.35 | 0.45 | 7.65 | 40 | 2210 | 430 | 2.2 |
| 18 | " | " | " | " | 7.95 | 46 | 3080 | 480 | 1.6 |
| 19* | Ta | 0.02 | 0.47 | 0.51 | 7.60 | 44 | 500 | 1050 | 1.2 |
| 20 | " | " | " | " | 7.93 | 51 | 720 | 1110 | 1.0 |
| 21* | " | 0.05 | 0.48 | 0.47 | 7.47 | 50 | 2270 | 1030 | 1.4 |
| 22 | " | " | " | " | 7.97 | 59 | 3030 | 1120 | 1.0 |
| 23* | " | 0.10 | 0.48 | 0.42 | 7.55 | 32 | 1190 | 610 | 1.7 |
| 24 | " | " | " | " | 8.02 | 37 | 1630 | 700 | 1.3 |

As will be seen from the typical results given in the table, the powder according to this invention may have compositions represented by the following formulae:

1. Pb(Zr$_p$.Ti$_q$)O$_3$, where $p$ and $q$ represent mol ratios and are given by:

$p + q = 1.00$, $0.10 \leq p \leq 0.55$, and $0.45 \leq q \leq 0.90$;

2. Pb(Mn$_{1/3}$.Sb$_{2/3}$)$_x$.Ti$_y$.Zr$_z$.O$_3$, where $x$, $y$, and $z$ represent mol ratios, the sum of $x$, $y$, and $z$ being equal to 1.00, and $x$, $y$, and $z$ fall on the boundary of and within a heptagon ABCDEFG in a triangular compositional diagram of a ternary-system solid solution shown in FIG. 1, the vertices A, B, C, D, E, F, and G of the heptagon being given by:

| | x | y | z |
|---|---|---|---|
| A | 0.10 | 0.80 | 0.10 |
| B | 0.01 | 0.71 | 0.28 |
| C | 0.01 | 0.09 | 0.90 |
| D | 0.05 | 0.05 | 0.90 |
| E | 0.30 | 0.05 | 0.65 |
| F | 0.30 | 0.50 | 0.20 |
| G | 0.20 | 0.70 | 0.10; |

Figure 2:
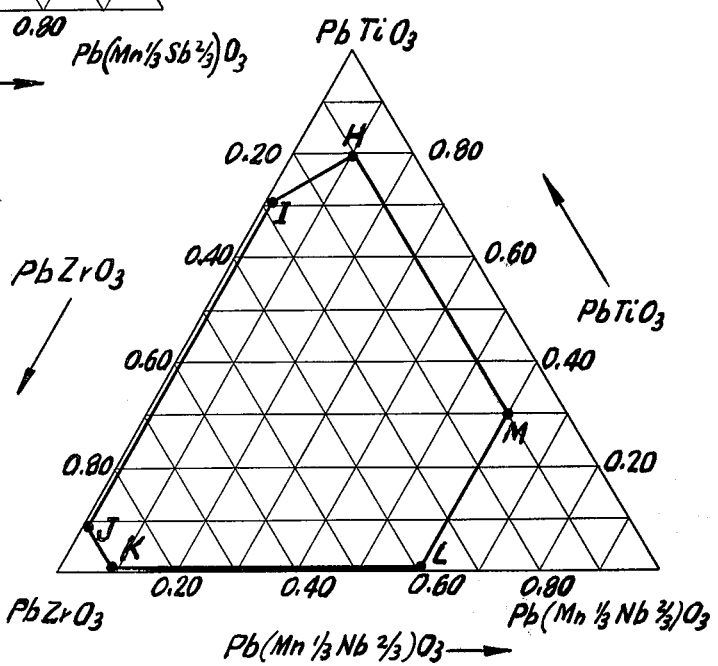
FIG. 2 is a like diagram of solid solution of $Pb(Mn_{1/3}\cdot Nb_{2/3})O_3$, $PbTiO_3$, and $PbZrO_3$.
Figure 3:
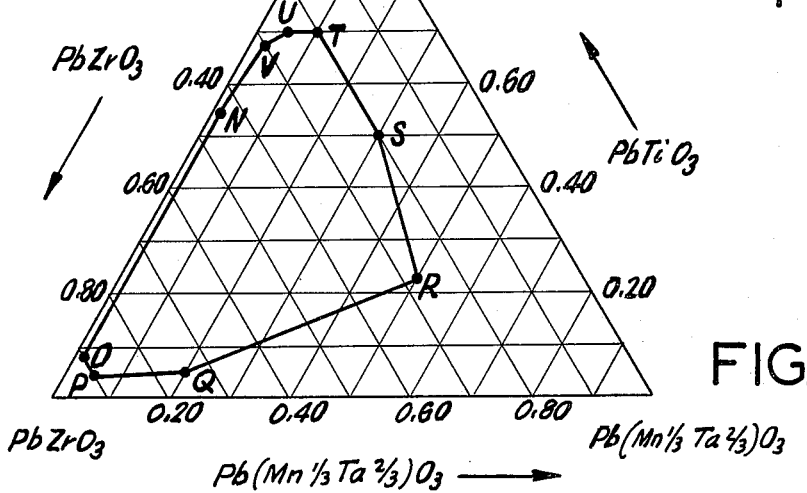
FIG. 3 is a like diagram of solid solution of $Pb(Mn_{1/3}\cdot Ta_{2/3})O_3$, $PbTiO_3$, and $PbZrO_3$.

3. Pb(Mn$_{1/3}$.Nb$_{2/3}$)$_x$.Ti$_y$.Zr$_z$.O$_3$, where $x$, $y$, and $z$ represent mol ratios, the sum of $x$, $y$, and $z$ being equal to 1.00, and $x$, $y$, and $z$ fall on the boundary of and within a hexagon HIJKLM in a triangular compositional diagram of a ternary-system solid solution shown in FIG. 2, the vertices H, I, J, K, L, and M of the hexagon being given by:

| | x | y | z |
|---|---|---|---|
| H | 0.10 | 0.80 | 0.10 |
| I | 0.01 | 0.71 | 0.28 |
| J | 0.01 | 0.09 | 0.90 |
| K | 0.10 | 0.00 | 0.90 |
| L | 0.60 | 0.00 | 0.40 |
| M | 0.60 | 0.30 | 0.10; | and (4.Pb(Mn$_{1/3}$.Ta$_{2/3}$)$_x$.Ti$_y$.Zr$_z$.O$_3$, where $x$, $y$, and $z$ represent mol ratios, the sum of $x$, $y$, and $z$ being equal to 1.00, and $x$, $y$, and $z$ fall on the boundary of and within a nonagon NOPQRSTUV in a triangular compositional diagram of a ternary-system solid solution shown in FIG. 3, the vertices N, O, P, Q, R, S, T, U, and V of the nonagon being given by:

| | x | y | z |
|---|---|---|---|
| N | 0.01 | 0.55 | 0.44 |
| O | 0.01 | 0.09 | 0.90 |
| P | 0.05 | 0.05 | 0.90 |
| Q | 0.20 | 0.05 | 0.75 |
| R | 0.50 | 0.23 | 0.27 |
| S | 0.30 | 0.50 | 0.20 |
| T | 0.10 | 0.70 | 0.20 |
| U | 0.05 | 0.70 | 0.25 |
| V | 0.02 | 0.68 | 0.30. |

It has been confirmed that the powder may include, as a portion of the composition and in the manner known in the art, alkaline earth metal or metals, such as Ba and Sr, rare earth metal or metals, such as La, transition element or elements, such as Co and Ni, and/or a small amount of other additional metallic element or elements capable of improving the piezoelectric characteristics.

With the processes according to this invention, the crystalline powder is obtained directly in water. As a result, the productivity is high. In addition, it is easy to separate the precipitate from the mother liquor by filtration and to wash the separated precipitate with water. The powder is only of the perovskite structure, whose composition is uniform and little subject to fluctuation.

It is readily seen also from the foregoing table that the piezoelectric ceramics made of the powder according to this invention have remarkably high sintered density without the hot pressing resorted to. In addition, the piezoelectric ceramics have improved piezoelectric characteristics and are sintered without presintering, at lower temperatures than the piezoelectric ceramics made by conventional methods, and without the oxygen atmosphere that has been indispensible to achieve higher sintered densities. The piezoelectric ceramics according to this invention are therefore well suited to high-power ultrasonic transducers, base plates for elastic surface waves, and elements for electrooptical applications. With the fine crystalline powder according to this invention, it is possible to manufacture without the hot pressing resorted to piezoelectric ceramics of the sintered density of 7.8 or more at a temperature of sinter as low as 950°C.

What is claimed is:

1. A process for producing crystalline powder of a composition given by the chemical formula: $Pb\,Ti_q\,Zr_p\,O_3$, where y and z represent mol ratios, the sum of q and p being equal to 1.00, the mol ratio q being not smaller than 0.45 and not greater than 0.90, the mol ratio p being not smaller than 0.10 and not greater than 0.55, comprising the steps of:
preparing an acidic aqueous solution of the metallic elements in the mol ratios given in said formula,
neutralizing said aqueous solution to provide a suspension of hydroxides of the metallic elements,
subjecting said suspension in an autoclave under pressure to a temperature between 150° and 300°C for a time sufficient to produce crystalline precipitate of said composition and of an average particle size between 0.02 and 0.2 micron in a mother liquor, and
separating said precipitate from said mother liquor.

2. A process for preparing a composition represented by the chemical formula: $Pb(Mn_{1/3}.Sb_{2/3})_x.Ti_y.Zr_z.O_3$, where $x$, $y$ and $z$ represent mol ratios, the sum of x, y and z being equal to 1.00, and x, y, and z fall on the boundary of and within a heptagon ABCDEFG in a triangular compositional diagram of a ternary-system solid solution shown in FIG. 1, the vertices A, B, C, D, E, F, and G of said heptagon being given by:

|   | x | y | z |
|---|------|------|------|
| A | 0.10 | 0.80 | 0.10 |
| B | 0.01 | 0.71 | 0.28 |
| C | 0.01 | 0.09 | 0.90 |
| D | 0.05 | 0.05 | 0.90 |
| E | 0.30 | 0.05 | 0.65 |
| F | 0.30 | 0.50 | 0.20 |
| G | 0.20 | 0.70 | 0.10, | said process comprising the steps of:
preparing an aqueous solution of the metallic elements in the mol ratios given in said formula,
neutralizing said aqueous solution to provide a suspension of hydroxides of said metallic elements,
subjecting said suspension in an autoclave under pressure to a temperature between 150° and 300°C for a time sufficient to produce crystalline precipitate of said composition and of an average particle size between 0.02 and 0.2 micron in a mother liquor, and
separating said precipitate from said mother liquor.

3. A process for preparing a composition represented by the formula: $Pb(Mn_{1/3}.Nb_{2/3})_x.Ii_y.Zr_z.O_3$, where $x$, $y$ and $z$ represent mol ratios, the sum of x, y, and z being equal to 1.00, and x, y and z fall on the boundary of and within a hexagon HIJKLM in a triangular compositional diagram of a ternary-system solid solution shown in FIG. 2, the vertices H, I, J, K, L and M of said hexagon being given by:

|   | x | y | z |
|---|------|------|------|
| H | 0.10 | 0.80 | 0.10 |
| I | 0.01 | 0.71 | 0.28 |
| J | 0.01 | 0.09 | 0.90 |
| K | 0.10 | 0.00 | 0.90 |
| L | 0.60 | 0.00 | 0.40 |
| M | 0.60 | 0.30 | 0.10, | said process comprising the steps of:
preparing an aqueous soluton of the metallic elements in the mol ratios given in said formula,
neutralizing said aqueous solution to provide a suspension of hydroxides of said metallic elements,
subjecting said suspension in an autoclave under pressure to a temperature between 150° and 300°C for a time sufficient to produce cyrstalline precipitate of said composition and of an average particle size between 0.02 and 0.2 micron in a mother liquor, and
separating said precipitate from said mother liquor.

4. A process for preparing a composition represented by the formula: $Pb(Mn_{1/3}.Ia_{2/3})_x.Ii_y.Zr_zO_3$, where $x$, $y$ and $z$ represent mol ratios, the sum of $x$, $y$ and $z$ being equal to 1.00, and $x$, $y$ and $z$ fall on the boundary of and within a nonagon NOPQRSTUV in a triangular compositional diagram of a ternary-system solid solution shown in FIG. 3, the vertices N, O, P, Q, R, S, T, U, and V of said nonagon being given by:

|   | x | y | z |
|---|------|------|------|
| N | 0.01 | 0.55 | 0.44 |
| O | 0.01 | 0.09 | 0.90 |
| P | 0.05 | 0.05 | 0.90 |
| Q | 0.20 | 0.05 | 0.75 |
| R | 0.50 | 0.23 | 0.27 |
| S | 0.30 | 0.50 | 0.20 |
| T | 0.10 | 0.70 | 0.20 |
| U | 0.05 | 0.70 | 0.25 |
| V | 0.02 | 0.68 | 0.30, | said process comprising the steps of:
preparing an aqueous solution of the metallic elements in the mol ratios given in said formula,
neutralizing said aqueous solution to provide a suspension of hydroxides of said metallic elements,
subjecting said suspension in an autoclave under pressure to a temperature between 150° and 300°C for a time sufficient to produce cyrstalline precipitate of said composition and of an average particle size between 0.02 and 0.2 micron in a mother liquor, and
separating said precipitate from said mother liquor.

* * * * *